(12) United States Patent
Knittl

(10) Patent No.: US 7,808,074 B2
(45) Date of Patent: Oct. 5, 2010

(54) ADVANCED LEADFRAME HAVING PREDEFINED BASES FOR ATTACHING PASSIVE COMPONENTS

(75) Inventor: Peter Knittl, Livonia, MI (US)

(73) Assignee: Infineon Technologies AG, Munich (DE)

(*) Notice: Subject to any disclaimer, the term of this patent is extended or adjusted under 35 U.S.C. 154(b) by 302 days.

(21) Appl. No.: 11/177,026

(22) Filed: Jul. 8, 2005

(65) Prior Publication Data

US 2007/0007631 A1 Jan. 11, 2007

(51) Int. Cl.
*H01L 23/495* (2006.01)
(52) U.S. Cl. .............. 257/528; 257/666; 257/787; 257/E33.059; 257/E33.066; 438/329; 438/123
(58) Field of Classification Search ............ 257/528, 257/666, 676, E33.059
See application file for complete search history.

(56) References Cited

U.S. PATENT DOCUMENTS

| 5,399,905 A * | 3/1995 | Honda et al. ............ 257/666 |
| 6,657,287 B2 | 12/2003 | Smith et al. |
| 6,713,836 B2 | 3/2004 | Liu et al. |
| 2002/0195693 A1* | 12/2002 | Liu et al. ............ 257/676 |
| 2005/0173783 A1* | 8/2005 | Chow et al. ............ 257/666 |

OTHER PUBLICATIONS

Infineon Technologies AG, Smart Hall Effect ICs for Active Wheel Speed Sensing, 2001, pp. 1-2, Germany.

* cited by examiner

*Primary Examiner*—Thao X Le
*Assistant Examiner*—Ajay K Arora

(57) ABSTRACT

A leadframe includes at least one lead extending from an integrated circuit and terminating at a connector pin. The lead includes multiple predefined bases to connect to one or more components external to the integrated circuit.

25 Claims, 8 Drawing Sheets

ADVANCED LEADFRAME HAVING PREDEFINED BASES FOR ATTACHING PASSIVE COMPONENTS

BACKGROUND

Electrical components such as sensors are often located in remote locations relative to a central control unit. In automotive applications, for example, sensors such as wheel sensors, transmission sensors, crank speed sensors, and cam shaft sensors typically are located remotely relative to a central electronic control unit (ECU). For various reasons, such as prevention of electrical overstress (EOS) over the harness or determination of DC offsets, additional electronic components may be required in close proximity to a sensor. Such additional components may include resistors and capacitors alone or in a resistor capacitor (RC) network configuration. For technological and/or cost reasons, such additional components often cannot be embedded in a sensing element.

In cases where several additional components are needed in close proximity to a sensing element, a printed circuit board (PCB) typically is placed between the sensing element and the connector terminals, and the additional components are populated on the PCB. The necessity of an additional PCB significantly increases the cost of the assembly and also may raise reliability issues due to induced electrical stress, space limitations, and the extra soldering and welding involved.

SUMMARY

A leadframe includes at least one lead extending from an integrated circuit and terminating at a connector pin. The lead includes multiple predefined bases to connect to one or more components external to the integrated circuit.

DETAILED DESCRIPTION

Figure 1:
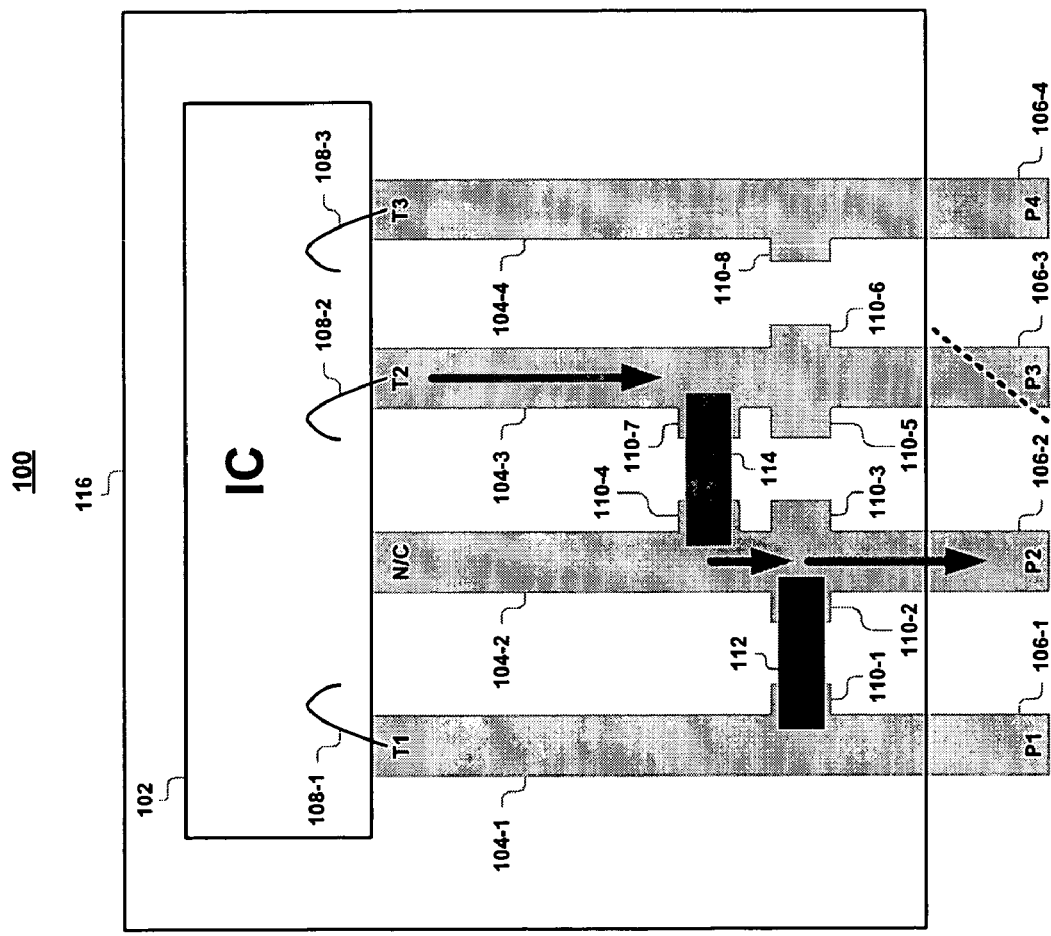
FIG. 1 illustrates one embodiment of a leadframe.

FIG. 1 illustrates one embodiment of a leadframe 100. In various embodiments, the leadframe 100 may comprise or be implemented as an advanced leadframe assembly. While the leadframe 100 may be shown as having a particular arrangement by way of example, it can be appreciated that the leadframe 100 may be arranged in various ways. For example, the leadframe 100 may be configured as a single-sided or multi-sided leadframe, an asymmetric or symmetric leadframe, and/or an internal or external leadframe. In various implementations, the leadframe 100 may be constructed from sheet metal by precision-die-stamping or chemical etching, for example.

The leadframe 100 may be arranged to support an integrated circuit (IC) 102. The IC 102 may comprise a semiconductor substrate such as silicon or gallium arsenide (GaAs), for example. In various embodiments, the IC 102 may comprise circuitry designed to perform one or more operations. The circuitry may comprise various processing components implemented by microelectronic, mechanical, and/or electro-mechanical elements fabricated on the substrate using silicon-based IC processes such as bipolar, complementary metal oxide semiconductor (CMOS), and bipolar CMOS (BiCMOS) processes, for example.

In various embodiments, the IC 102 may comprise or be implemented as a sensing element. The sensing element may comprise, for example, a pressure sensor, a temperature sensor, a Hall Effect sensor, and/or other type of active sensor. In various implementations, the sensing element may be used to provide system diagnostics, signal conditioning, and/or detection of system attributes such as component displacement, rotation, speed, and position relative to other components. In automotive applications, for example, the sensing element may be arranged to sense wheel speed in an anti-lock braking system (ABS), detect crankshaft speed and position, detect camshaft position, sense transmission speed, detect gas pedal position, detect throttle position, monitor tire pressure, monitor airbag pressure, monitor barometric pressure (BAP), monitor manifold absolute pressure (MAP), control suspension, detect position of seats, power windows, sunroof and seat belts, and/or sense temperature for various components. The embodiments are not limited in this context.

The leadframe 100 may comprise one or more leads. As shown in FIG. 1, for example, the leadframe 100 comprises multiple leads 104-1-4 extending from the IC 102. The leads 104-1-4 may comprise a conductive metal such as copper based alloys or ferrous alloys, for example. In various embodiments, the leads 104-1-4 may terminate at connector pins. As shown in FIG. 1, for example, the leads 104-1-4 terminate at connector pins (P1-P4) 106-1-4. In various implementations, the connector pins 106-1-4 may be arranged to connect to external wiring and/or an external system (e.g., ECU), for example. Although FIG. 1 illustrates a limited number of leads by way of example, it can be appreciated that a greater or a fewer number of leads may used for a given implementation.

In various implementations, one or more of the leads 104-1-4 may be connected to the IC 102 by die wire bonding or tape automated bonds, for example. The connections may form electrical contacts and/or current interfaces to the IC 102. As shown in FIG. 1, one embodiment of the leadframe 100 comprises a three-wire configuration. In this embodiment, a first wire bond 108-1 connects the first lead 104-1 to the IC 102, a second wire bond 108-2 connects the third lead 104-3 to the IC 102, and a third wire bond 108-3 connects the fourth lead 104-4 to the IC 102.

In various embodiments, selective die wire bonding to the leadframe 100 may implement different input/output paths to the IC 102. As shown in FIG. 1, for example, the leadframe 100 comprises input/output paths (T1-T3, N/C) to the IC 102 formed by the wire bonds 108-1-3. In this embodiment, the first lead 104-1 comprises a path T1, the second lead 104-2 comprises a no connection (N/C) path, the third lead 104-3 comprises a path T2, and the fourth lead 104-4 comprises a path T3.

The leads 104-1-4 may comprise one or more predefined bases or pads. As shown in FIG. 1, for example, the leads 104-1-4 comprise predefined bases 110-1-8. In this embodiment, the first lead 104-1 comprises a first predefined base 110-1. The second lead 104-2 comprises a second predefined base 110-2, a third predefined base 110-3, and a fourth predefined base 110-4. The third lead 104-3 comprises a fifth predefined base 110-5, a sixth predefined base 110-6, and a seventh predefined base 110-7. The fourth lead 104-4 comprises an eighth predefined base 110-8. Although FIG. 1 illustrates a limited number of predefined bases or pads by way of example, it can be appreciated that a greater or a fewer number of predefined bases or pads may used for a given implementation. In addition, while a particular arrangement may be shown by way of example, it can be appreciated that the predefined based 110-1-8 may be arranged in other ways. In some cases, the predefined bases 110-1-8 may be arranged to allow the leadframe 100 to bend toward a sensing target. The embodiments are not limited in this context.

In various embodiments, the predefined bases 110-1-8 may be arranged to attach to one or more external components. The external components may comprise surface mount components (SMD), for example. The external components may be placed on the leadframe 100 in proximity to the IC 102 and attached to the predefined bases by soldering, for example.

In various implementations, the external components may be arranged to enhance electromagnetic compatibility (EMC), reduce electrostatic discharge (ESD) and/or reduce electrical overstress (EOS). In such implementations, the external components may comprise one or more resistors and/or capacitors (e.g., leaded capacitor, blocking capacitor), an RC network, or other passive components, for example. The external components also may be arranged to adjust signal offset to sense values in measuring applications. For example, a capacitor may be used to adjust signal offset in measuring applications. The embodiments are not limited in this context.

In various implementations, the selection and/or configuration of the external components may conform to the requirements of a vendor. A vendor may comprise an original equipment manufacturer (OEM), an original design manufacturer (ODM), an independent hardware vendor (IHV), and so forth. In some cases, a manufacture may select and/or configure the external components according to various design and performance requirements (e.g., EMC, ESD and/or EOS requirements) of one or more vendors. In other cases, a vendor may select and/or configure the external components according to its design and performance requirements. The external components may be integrated to the leadframe by the manufacture and/or by the vendor.

In various implementations, the dimensions and/or characteristics of the external components may require separation from the IC 102. For example, external component often have dimensions which do not support integration into an IC due to space limitations. The embodiments are not limited in this context.

In one embodiment, shown in FIG. 1, the leadframe 100 comprises a first external component 112 and a second external component 114. The first external component 112 may comprise a capacitor, and the second external 114 component may comprise a resistor, for example. In this embodiment, the first external component 112 is attached to the predetermined base 110-1 of the first lead 104-1 and the predetermined base 110-2 of the second lead 104-2. The second external component 114 is attached to the predetermined base 110-4 of the second lead 104-2 and the predetermined base 110-7 of the third lead 104-3.

In various embodiments, one or more of the external components may be arranged to operate in parallel to the input/output paths of the IC 102. As shown in FIG. 1, for example, the leadframe 100 comprises input/output paths (T1-T3, N/C) to the IC 102. In this embodiment, the first external component 112 operates in parallel to the path T1. In one implementation, the first external component 112 may comprise a blocking capacitor placed as a crossover between the path T1 and the path N/C. In this implementation, the path T1 would experience a parallel capacitance.

In various embodiments, one or more of the external components may be arranged to operate in serial to the input/output paths of the IC 102. A serial connection may comprise multiple paths and/or multiple leads. In one embodiment, for example, the second external component 114 comprises a resistor placed as a crossover between the path T2 and the path N/C. In this embodiment, a serial connection (illustrated by arrows in FIG. 1) comprises a portion of the path T2 of the third lead 104-3 and a portion of the path N/C of the second lead 104-2.

In various embodiments, an excessive piece of one or more leads 104-1-4 may be severed. In some cases, a signal may float when a pin is not connected causing the lead to receive electrical peaks, for example. Severing the lead may prevent additional EMC stress. As shown in FIG. 1 (illustrated by broken line in FIG. 1), for example, an excessive piece of the third lead 104-3 may be severed.

The leadframe 100 comprises a package or housing 116. In various embodiments, the housing 116 may comprise a plastic, ceramic or metal enclosure. The housing 116 may be formed by premolding and/or overmolding, for example. The housing 116 may be arranged to enclose and protect the IC 102, the leads 104-1-4, and/or external components 112 and 114. In various implementations, the housing 116 may comprise plastic overmolding to form a sealed enclosure for protecting the assembly against environmental conditions such as intermittent contact problems. While a particular arrangement may be shown by way of example, it can be appreciated that the housing 116 may be arranged in other ways. In some cases, for example, the external components 112 and 114 may not be enclosed by the housing 116.

Figure 2:
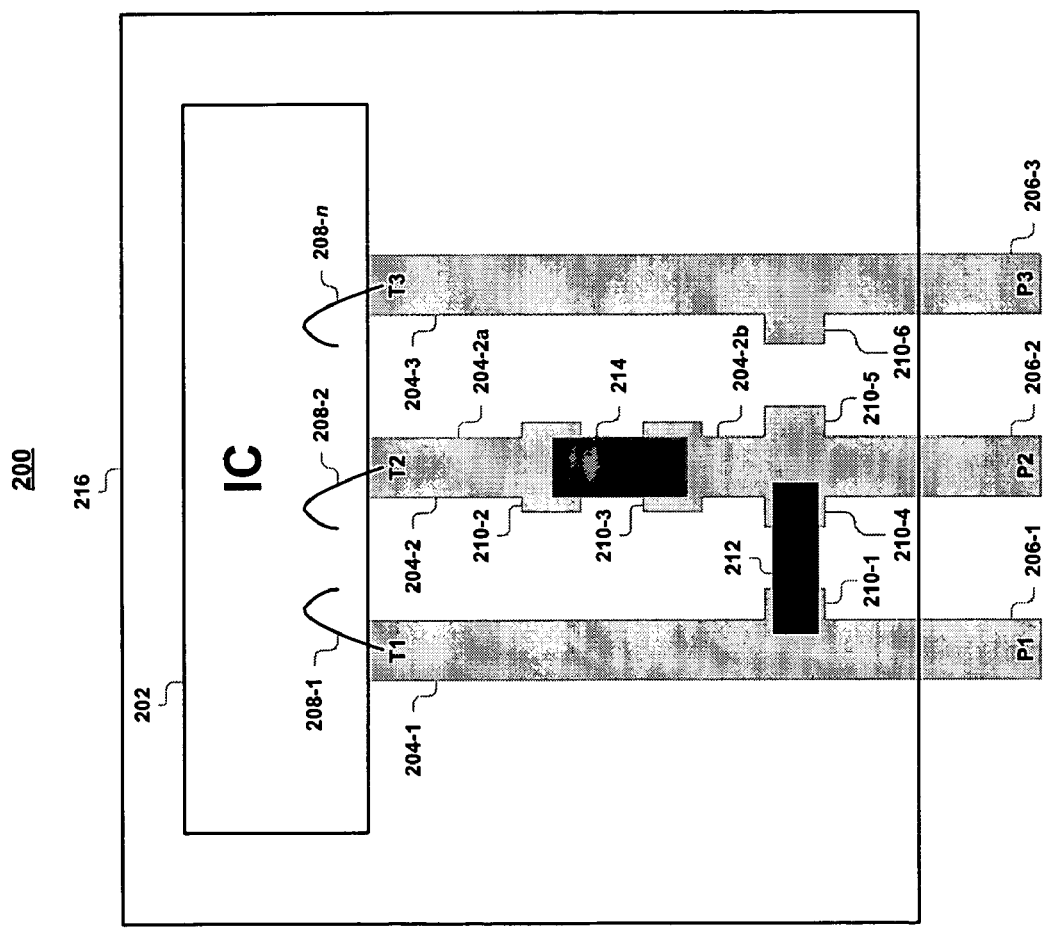
FIG. 2 illustrates one embodiment of a leadframe.

FIG. 2 illustrates one embodiment of a leadframe 200. In various embodiments, the leadframe 200 may comprise or be implemented as an advanced leadframe assembly. While the leadframe 200 may be shown as having a particular arrangement by way of example, it can be appreciated that the leadframe 200 may be arranged in various ways.

The leadframe assembly 200 may be arranged to support an IC 202 and may comprise multiple leads 204-1-3 extending from the IC 202 and terminating at connector pins (P1-P3) 206-1-3. In various embodiments one or more of the leads 204-1-4 may be separated or disjointed. As shown in FIG. 2, for example, the second lead 204-2 is separated into an upper portion 204-2a and a lower portion 204-2b. Although FIG. 2 illustrates a limited number of leads by way of example, it can be appreciated that a greater or a fewer number of leads may used for a given implementation.

In various implementations, one or more of the leads 204-1-3 may be connected to the IC 202 by die wire bonding or tape automated bonds, for example. As shown in FIG. 2, one embodiment of the leadframe 200 comprises a three-wire configuration. In this embodiment, a first wire bond 208-1 connects the first lead 204-1 to the IC 202, a second wire bond 208-2 connects the second lead 204-2 to the IC 202, and a third wire bond 208-3 connects the third lead 204-3 to the IC 202.

In various embodiments, selective die wire bonding to the leadframe 200 may implement different input/output paths to the IC 202. As shown in FIG. 2, for example, the leadframe 200 comprises input/output paths (T1-T3) to the IC 202 formed by the wire bonds 208-1-3. In this embodiment, the first lead 204-1 comprises a path T1, the second lead 204-2 comprises a path T2, and the third lead 204-3 comprises a path T3.

As shown in FIG. 2, for example, the leads 204-1-3 comprise predefined bases 210-1-6. In this embodiment, the first lead 204-1 comprises a first predefined base 210-1. The upper portion 204-2a of the second lead 204-2 comprises a second predefined base 210-2. The lower portion 204-2b of the second lead 204-2 comprises a third predefined base 210-3, a fourth predefined base 210-4, and a fifth predefined base 210-5. The third lead 204-3 comprises a sixth predefined base 210-6. Although FIG. 2 illustrates a limited number of predefined bases or pads by way of example, it can be appreciated that a greater or a fewer number of predefined bases or pads may used for a given implementation. In addition, while a particular arrangement may be shown by way of example, it can be appreciated that the predefined based 210-1-6 may be arranged in other ways.

In various embodiments, the predefined bases 210-1-6 may be arranged to attach to one or more external components. In one embodiment, shown in FIG. 2, the leadframe 200 comprises a first external component 212 and a second external component 214. The first external component 212 may comprise a capacitor, and the second external 214 component may comprise a resistor, for example. In this embodiment, the first external component 212 is attached to the predetermined base 210-1 of the first lead 204-1 and the predetermined base 210-4 of the lower portion 204-2b of the second lead 204-2. The second external component 214 is attached to the predetermined base 210-2 of the upper portion 204-2a of the second lead 204-2 and the predetermined base 210-3 of the lower portion 204-2b of the second lead 204-2.

In various embodiments, one or more of the external components may be arranged to operate in parallel to the input/output paths of the IC 202. As shown in FIG. 2, for example, the leadframe 200 comprises input/output paths (T1-T3) to the IC 202. In this embodiment, the first external component 212 operates in parallel to the path T1. In one implementation, the first external component 212 may comprise a blocking capacitor placed as a crossover between the path T1 and the path T2. In this implementation, the path T1 would experience a parallel capacitance.

In various embodiments, one or more of the external components may be arranged to operate in serial to input/output paths of the IC 202. In one embodiment, for example, the second external component 214 comprises a resistor placed as a bridge over the path T2. In this embodiment, a serial connection comprises an upper portion 204-2a and a lower portion 204-2b of the second lead 204-2.

The leadframe 200 comprises a package or housing 216. In various embodiments, the housing 216 may comprise a plastic, ceramic or metal enclosure. The housing 216 may be formed by premolding and/or overmolding, for example. The housing 216 may be arranged to enclose and protect the IC 202, the leads 204-1-3, and/or external components 212 and 214. In various implementations, the housing 216 may comprise plastic overmolding to form a sealed enclosure for protecting the assembly against environmental conditions such as intermittent contact problems. While a particular arrangement may be shown by way of example, it can be appreciated that the housing 216 may be arranged in other ways. In some cases, for example, the external components 212 and 214 may not be enclosed by the housing 216.

Figure 3:
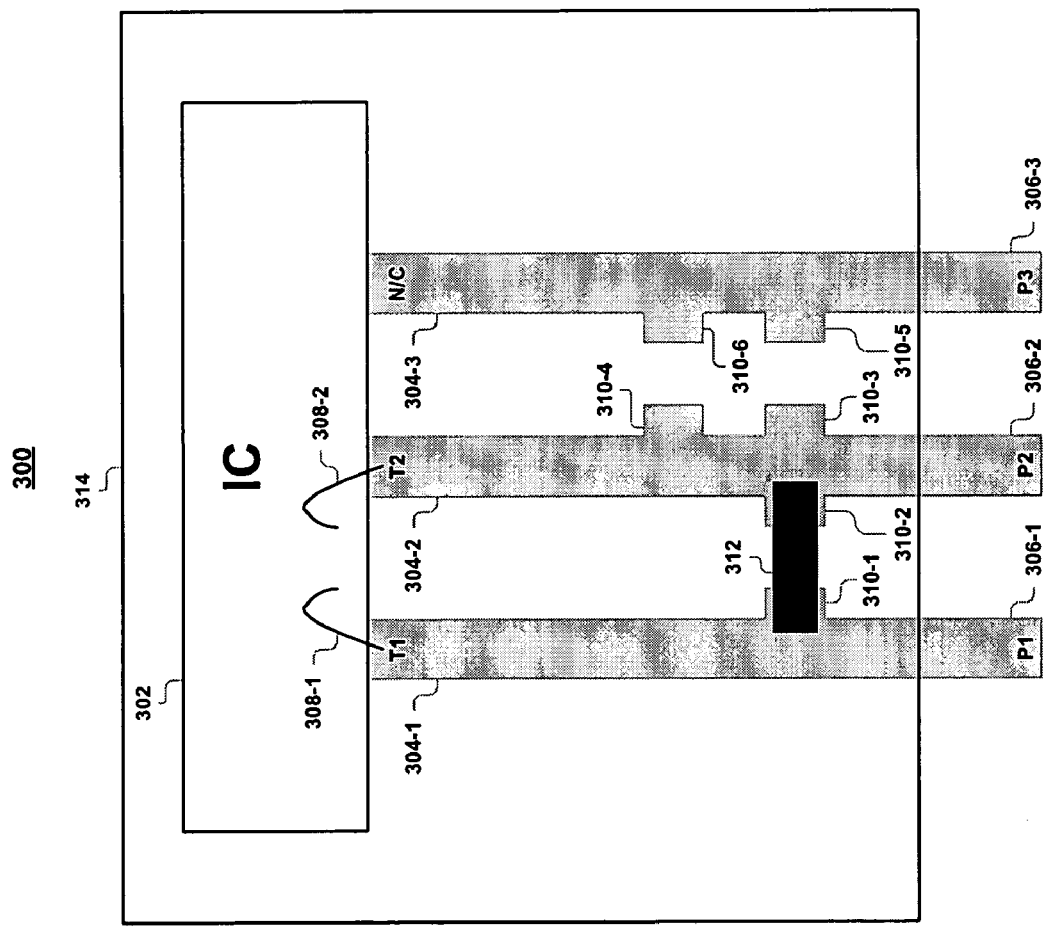
FIG. 3 illustrates one embodiment of a leadframe.

FIG. 3 illustrates one embodiment of a leadframe 300. In various embodiments, the leadframe 300 may comprise or be implemented as an advanced leadframe assembly. While the leadframe 300 may be shown as having a particular arrangement by way of example, it can be appreciated that the leadframe 300 may be arranged in various ways.

The leadframe assembly 300 may be arranged to support an IC 302 and may comprise multiple leads 304-1-3 extending from the IC 302 and terminating at connector pins (P1-P3) 306-1-3. Although FIG. 3 illustrates a limited number of leads by way of example, it can be appreciated that a greater or a fewer number of leads may used for a given implementation.

In various implementations, one or more of the leads 304-1-3 may be connected to the IC 302 by die wire bonding or tape automated bonds, for example. As shown in FIG. 3, one embodiment of the leadframe 300 comprises a two-wire configuration. In this embodiment, a first wire bond 308-1 connects the first lead 304-1 to the IC 302, and a second wire bond 308-2 connects the second lead 304-2 to the IC 302.

In various embodiments, selective die wire bonding to the leadframe 300 may implement different input/output paths to the IC 302. As shown in FIG. 3, for example, the leadframe 300 comprises input/output paths (T1, T2, N/C) to the IC 302 formed by the wire bonds 308-1-2. In this embodiment, the first lead 304-1 comprises a path T1, the second lead 304-2 comprises a path T2, and the third lead 304-3 comprises a path N/C.

As shown in FIG. 3, for example, the leads 304-1-3 comprise predefined bases 310-1-6. In this embodiment, the first lead 304-1 comprises a first predefined base 310-1. The second lead 304-2 comprises a second predefined base 310-2, a third predefined base 310-3, and a fourth predefined base 310-4. The third lead 304-3 comprises a fifth predefined base 310-5 and a sixth predefined base 310-6. Although FIG. 3 illustrates a limited number of predefined bases or pads by way of example, it can be appreciated that a greater or a fewer number of predefined bases or pads may used for a given implementation. In addition, while a particular arrangement may be shown by way of example, it can be appreciated that the predefined based 310-1-6 may be arranged in other ways.

In various embodiments, the predefined bases 310-1-6 may be arranged to attach to one or more external components. In one embodiment, shown in FIG. 3, the leadframe 300 comprises an external component 312. The external component 312 may comprise a capacitor, for example. In this embodiment, the external component 312 is attached to the predetermined base 310-1 of the first lead 304-1 and the predetermined base 310-2 of the second lead 304-2.

In various embodiments, one or more of the external components may be arranged to operate in parallel to the input/output paths of the IC 302. As shown in FIG. 3, for example, the leadframe 300 comprises input/output paths (T1, T2, N/C) to the IC 302. In this embodiment, the external component 312 operates in parallel to the path T1. In one implementation, the external component 312 may comprise a blocking capacitor placed as a crossover between the path T1 and the path T2. In this implementation, the path T1 would experience a parallel capacitance.

The leadframe 300 comprises a package or housing 314. In various embodiments, the housing 314 may comprise a plastic, ceramic or metal enclosure. The housing 314 may be formed by premolding and/or overmolding, for example. The housing 314 may be arranged to enclose and protect the IC 302, the leads 304-1-3, and/or external component 312. In various implementations, the housing 316 may comprise plastic overmolding to form a sealed enclosure for protecting the assembly against environmental conditions such as intermittent contact problems. While a particular arrangement may be shown by way of example, it can be appreciated that the housing 316 may be arranged in other ways. In some cases, for example, the external component 312 may not be enclosed by the housing 216.

Figure 4:
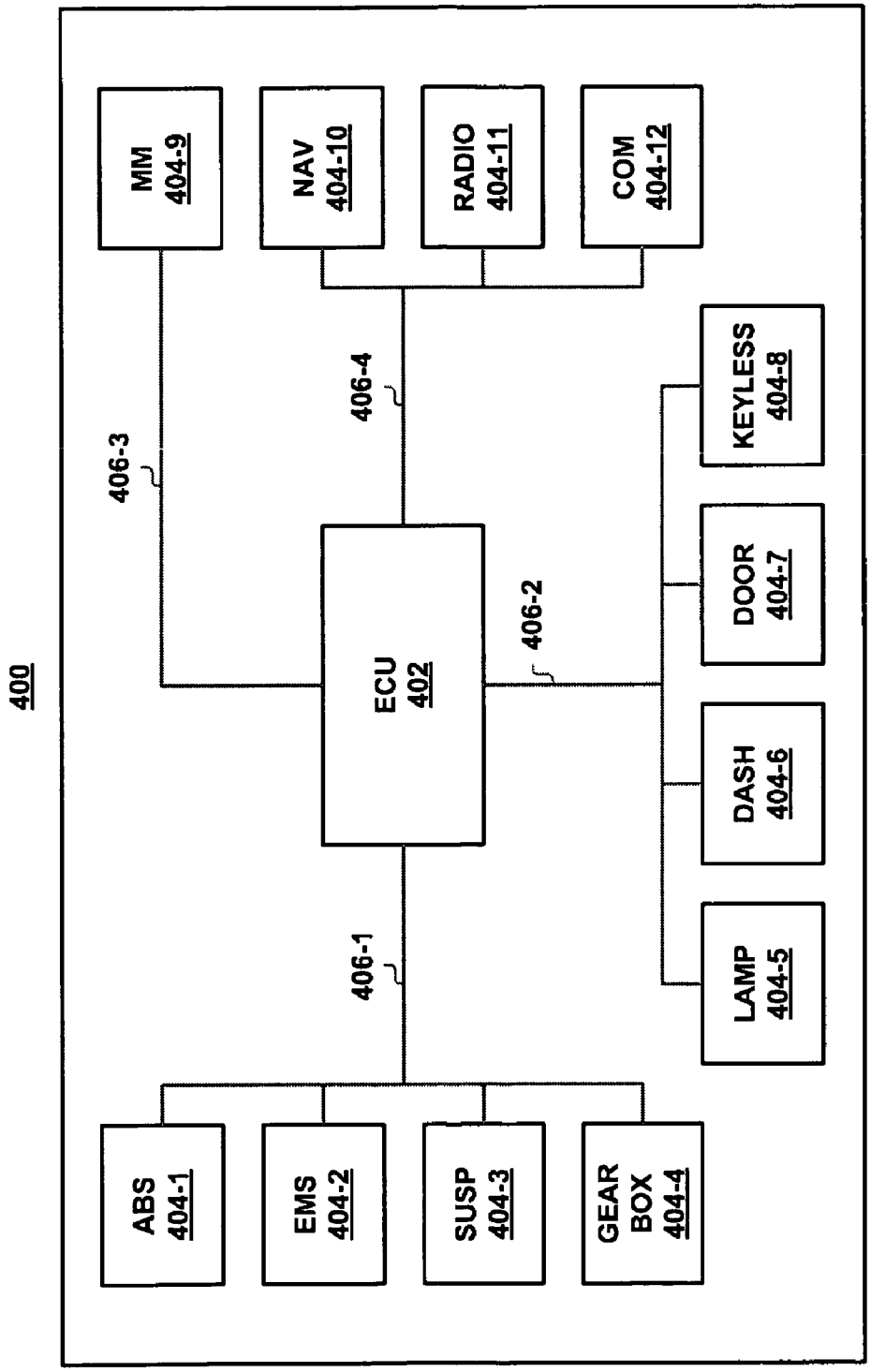
FIG. 4 illustrates one embodiment of a system.

FIG. 4 illustrates one embodiment of a system. FIG. 4 illustrates a block diagram of an automotive system 400. In various embodiments, the automotive system 400 may comprise one or more leadframes implemented by leadframe 100, leadframe 200, and/or leadframe 300, for example. The embodiments are not limited in this context.

As shown in FIG. 4, for example, the automotive system 400 comprises an ECU 402 coupled to various functional units 404-1-12 by buses 406-1-4. The ECU 402 may comprise, for example, a processing platform, computing platform, computing device, processing device, computing system, processing system, computer, processor, or the like, and may be implemented using any suitable combination of hardware and/or software.

As shown in FIG. 4, for example, the functional units 404-1-12 comprise an ABS control unit 404-1, an electromechanical steering (EMS) control unit 404-2, a suspension control unit 404-3, a gear box control unit 404-4, a lamp control unit 404-5, a dashboard control unit 404-6, a door module control unit 404-7, a keyless receiver control unit 404-8, a multimedia center control unit 404-9, a navigation control unit 404-10, a radio control unit 404-11, and/or a communications control unit 404-12. In various embodiments, one or more of the functional units 404-1-12 may comprise one or more sensing elements implementing a leadframe, such as leadframe 100, leadframe 200, and/or leadframe 300, for example.

In various embodiments, one or more of the buses 406-1-4 may be connected to a leadframe, such as leadframe 100, leadframe 200, and/or leadframe 300, for example. In various implementations, the buses 406-1-4 may comprise wired or wireless communications media. Examples of wired communications media may include a harness, wire, cable, printed circuit board (PCB), backplane, semiconductor material, twisted-pair wire, co-axial cable, fiber optics, and so forth. An example of wireless communication media may include portions of a wireless spectrum, such as the RF spectrum. In such embodiments, one or more of the functional units 404-1-12 may include components and interfaces suitable for communicating information signals over wireless communication media. Such components and interfaces may include, for example, one or more antennas, transmitters, receivers, transceivers, amplifiers, filters, control logic, and so forth.

Operations for various embodiments may be further described with reference to the following figures and accompanying examples. Some of the figures may include a logic flow. Although such figures presented herein may include a particular logic flow, it can be appreciated that the logic flow merely provides an example of how the general functionality as described herein can be implemented. Further, the given logic flow does not necessarily have to be executed in the order presented unless otherwise indicated. In some cases, the given logic flow may be implemented by hardware, software, and/or combination thereof.

Figure 5:
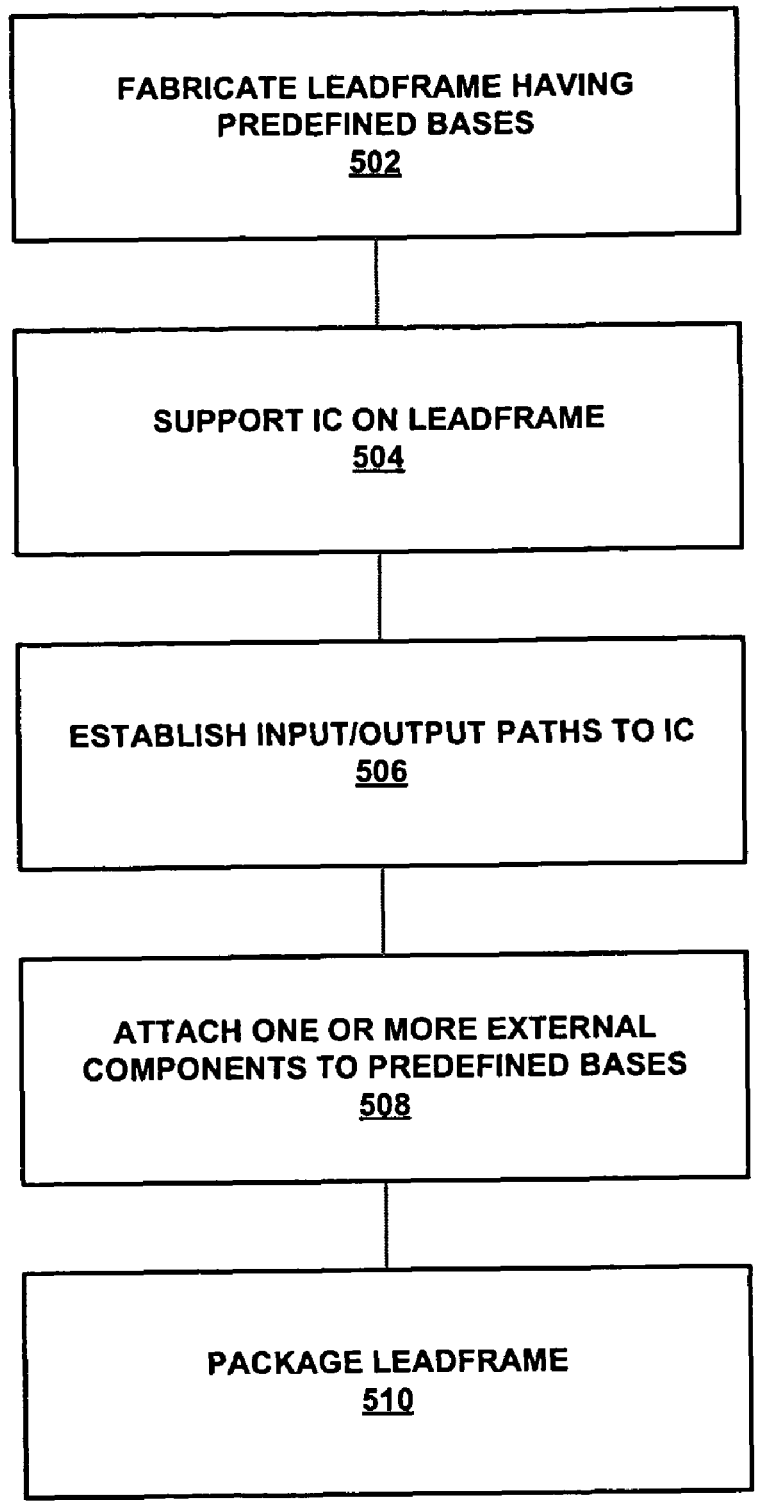
FIG. 5 illustrates one embodiment of a logic flow.

FIG. 5 illustrates one embodiment of a logic flow. FIG. 5 illustrates logic flow 500 for leadframe assembly. In various embodiments, the logic flow 500 may comprise fabricating a leadframe having predefined bases (block 502). The predefined bases may be arranged to attach one or more external components. In various embodiments, the leadframe may comprise multiple leads implementing the predefined bases.

The logic flow may comprise supporting an IC with the leadframe (block 504). In various embodiments, the IC may comprise or be implemented as a sensing element. In various implementations, the sensing element may be used in one or more automotive applications.

The logic flow 500 may comprise establishing one or more input/output paths to the IC (block 506). In various embodiments, one or more leads of the leadframe may be selectively wire bonded to the IC to form different input/output paths.

The logic flow 500 may comprise attaching one or more external components to the predetermined based of the leads (block 508). In various implementations, the external components may be attached by soldering. The external components may be attached to the leadframe by a manufacture and/or by a vendor. In various embodiments, the selection and/or configuration of the external components may conform to the requirements of a vendor such as an OEM, an ODM, an IHV, and so forth. In some cases, a manufacture may select and/or configure the external components according to various design and performance requirements (e.g., EMC, ESD and/or EOS requirements) of one or more vendors. In other cases, a vendor may select and/or configure the external components according to its design and performance requirements.

In various embodiments, one or more of the external components may be arranged to operate in parallel to the input/output paths of the IC. In various embodiments, one or more of the external components may be arranged to implement a serial connection between input/output paths of the IC. The embodiments are not limited in this context.

The logic flow 500 may comprise packaging the leadframe (block 510). In various embodiments, packaging may comprise integrating the external components and the IC (e.g., sensing element) within a housing. The housing may comprise a plastic, ceramic or metal enclosure. The housing may be formed by premolding and/or overmolding, for example. In one embodiment, packaging may comprise overmolding the IC and/or the external components with plastic. The housing may be arranged to enclose and protect the IC, the leads, and/or external components. In various implementations, the housing may form a sealed enclosure for protecting the assembly against environmental conditions such as intermittent contact problems. It can be appreciated that the housing may be arranged in various ways. In some cases, for example, the external components may not be enclosed by the housing.

Figure 6A:
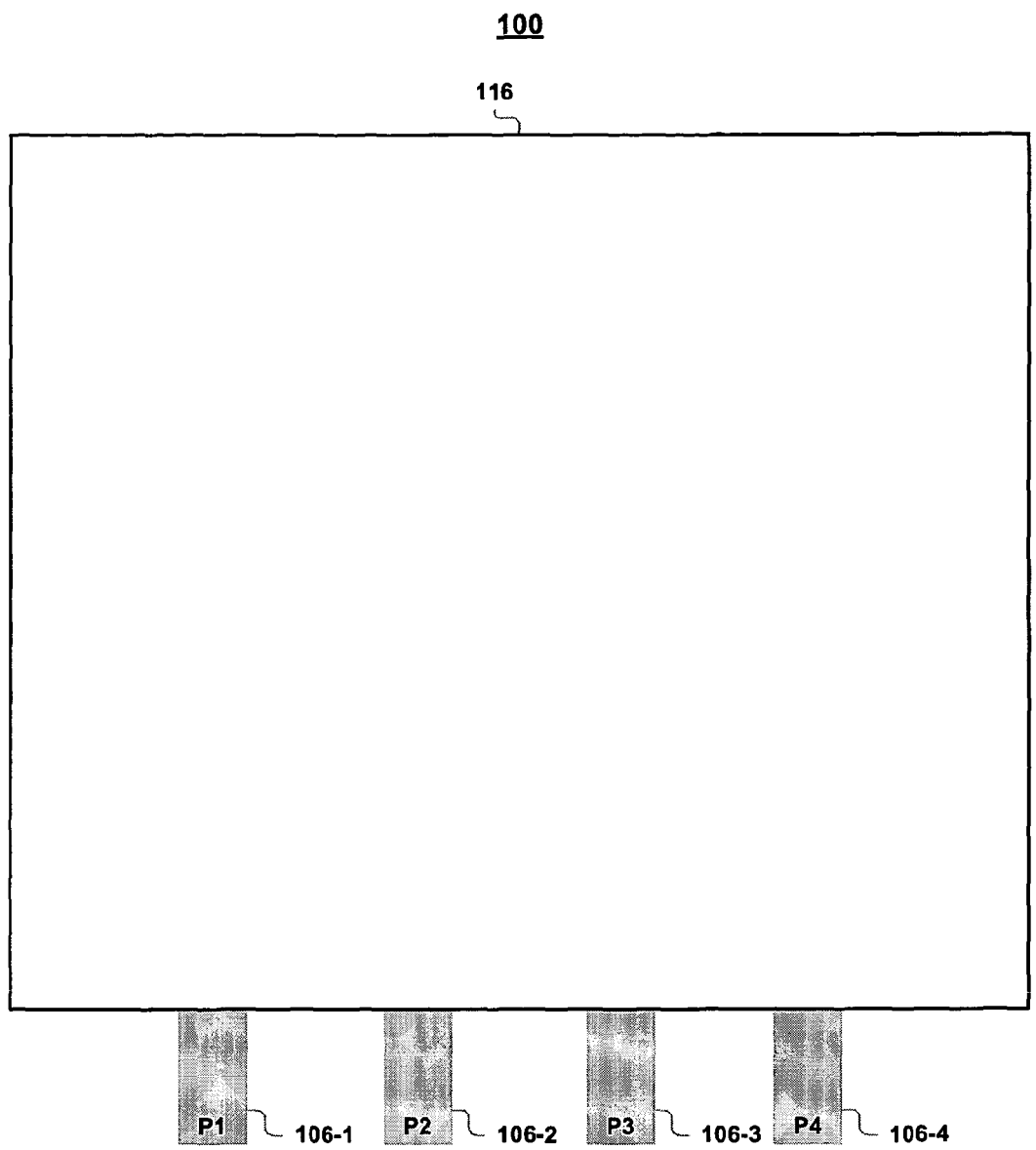
FIG. 6A illustrates one embodiment of a leadframe.
Figure 6B:
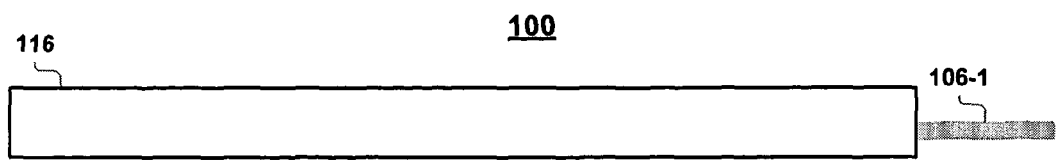
FIG. 6B illustrates one embodiment of a leadframe.

FIG. 6A and FIG. 6B illustrate one embodiment of a leadframe 100. The leadframe 100 comprises a housing 116. In various embodiments, the housing 116 may comprise a plastic, ceramic or metal enclosure. The housing 116 may be formed by premolding and/or overmolding, for example. In this embodiment, the housing 116 encloses the IC 102 and the external components 112 and 114. While the leadframe 100 may be shown as having a particular arrangement by way of example, it can be appreciated that the leadframe 100 may be arranged in various ways.

Figure 7A:
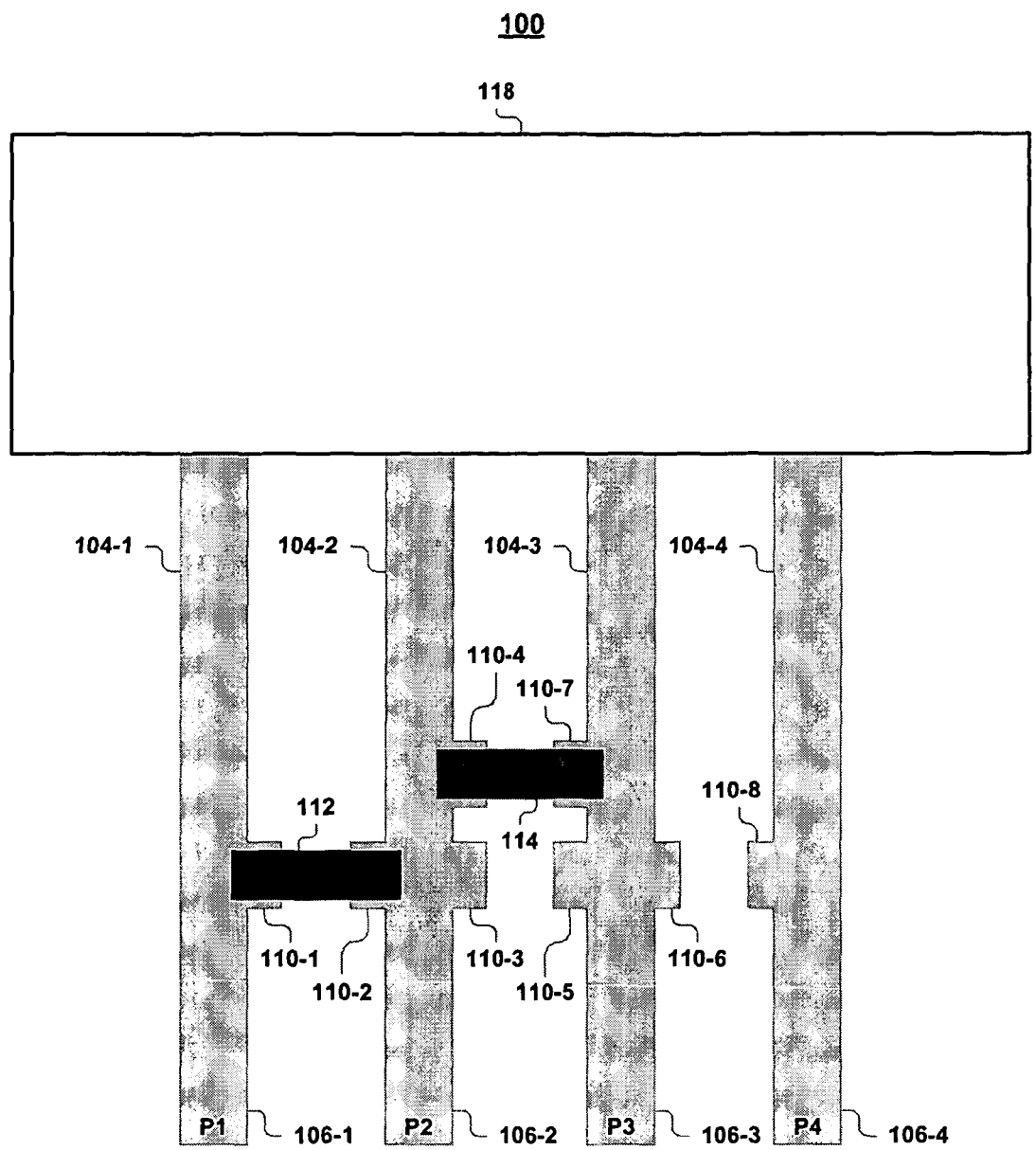
FIG. 7A illustrates one embodiment of a leadframe.
Figure 7B:
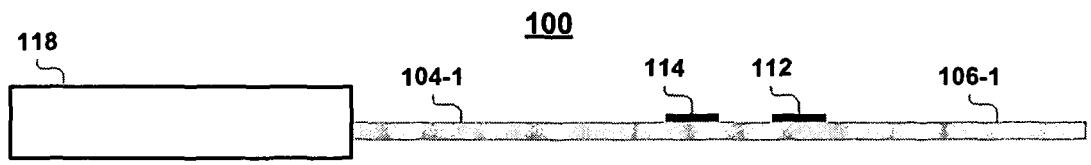
FIG. 7B illustrates one embodiment of a leadframe.

FIG. 7A and FIG. 7B illustrate one embodiment of a leadframe 100. The leadframe 100 comprises a housing 118. In various embodiments, the housing 118 may comprise a plastic, ceramic or metal enclosure. The housing 118 may be formed by premolding and/or overmolding, for example. In this embodiment, the housing 118 encloses the IC 102. While the leadframe 100 may be shown as having a particular arrangement by way of example, it can be appreciated that the leadframe 100 may be arranged in various ways.

Figure 8A:
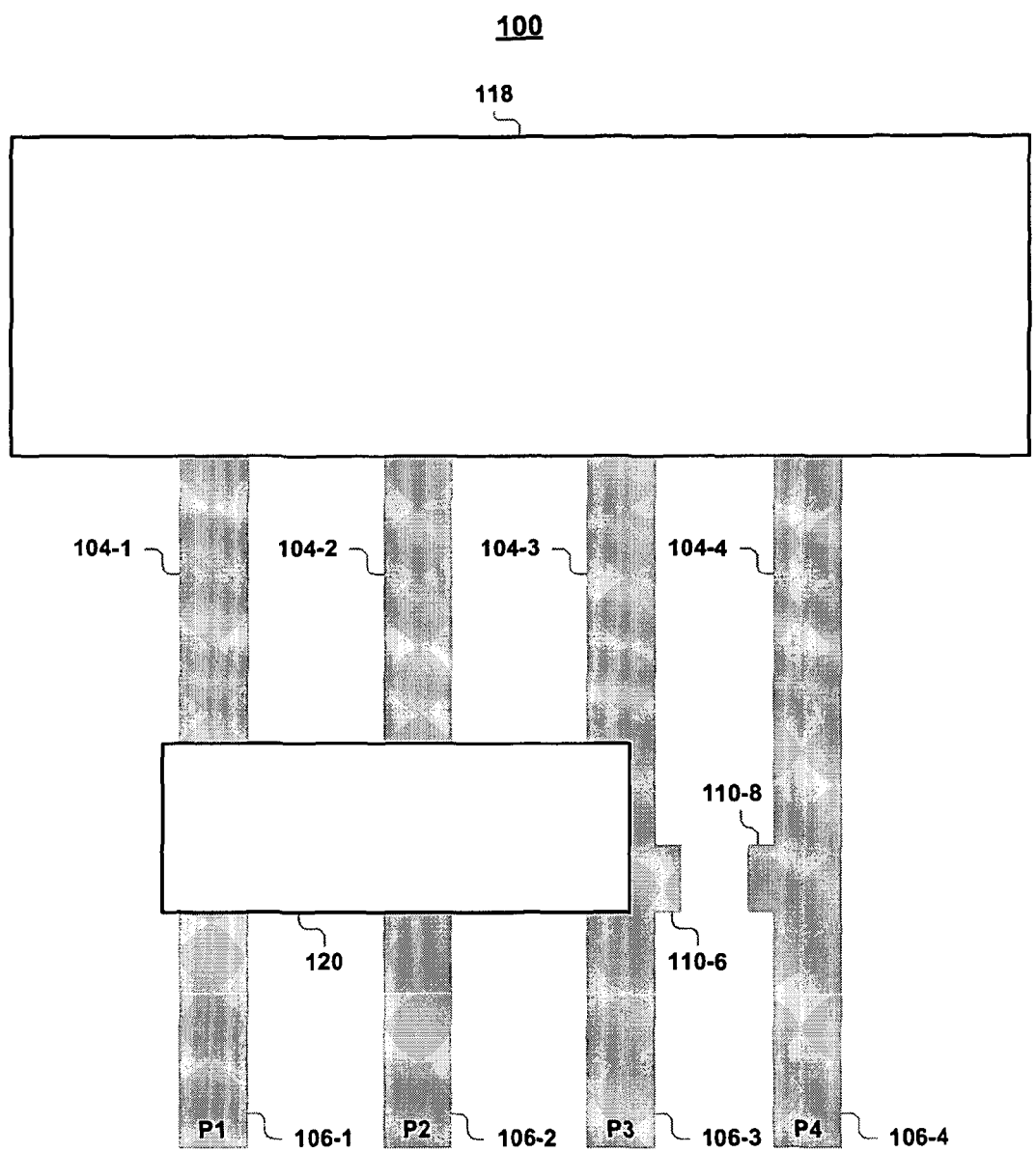
FIG. 8A illustrates one embodiment of a leadframe.
Figure 8B:
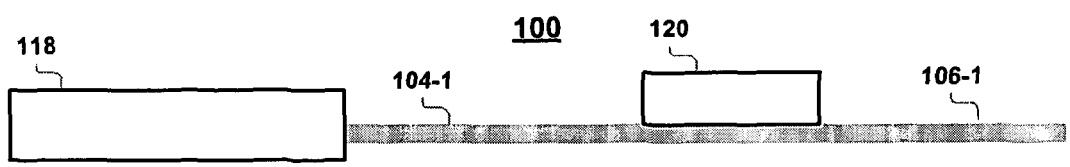
FIG. 8B illustrates one embodiment of a leadframe.

FIG. 8A and FIG. 8B illustrate one embodiment of a leadframe 100. The leadframe 100 comprises a first housing 118 and a second housing 120. In various embodiments, the first housing 118 and the second housing 120 may comprise plastic, ceramic or metal enclosures. The first housing 118 and the second housing 120 may be formed by premolding and/or overmolding, for example. In this embodiment, the first housing 118 encloses the IC 102, and the second housing 120 encloses the external components 112 and 114. While the leadframe 100 may be shown as having a particular arrangement by way of example, it can be appreciated that the leadframe 100 may be arranged in various ways.

In various implementations, the described embodiments may provide a flexible leadframe to reduce external visible electronic components. The leadframe may be implemented as a platform design for multiple applications. The described embodiments may reduce costs and improve reliability by eliminating the need of an additional PCB. The described embodiments may allow customers to achieve desired functionality with reduced design considerations. The embodiments are not limited in this context.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

It is also worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

While certain features of the embodiments have been illustrated as described herein, many modifications, substitutions, changes and equivalents will now occur to those skilled in the art. It is therefore to be understood that the appended claims are intended to cover all such modifications and changes as fall within the true spirit of the embodiments.

The invention claimed is:

1. An apparatus, comprising:
a leadframe comprising multiple leads extending linearly from an integrated circuit, said multiple leads comprising electrical contacts to form interfaces to said integrated circuit, wherein multiple electrical contacts are connected to said integrated circuit for establishing multiple paths to said integrated circuit from an external system;
multiple components placed on said multiple leads external to said integrated circuit and comprising at least a blocking capacitor placed between multiple paths to enhance electromagnetic compatibility; and
a first housing and a second housing encapsulating separate portions of said leadframe and comprising separate plastic overmoldings to form sealed enclosures for protecting said separate portions, said first housing enclosing said integrated circuit, said second housing enclosing said multiple components external to said integrated circuit, said multiple leads extending from said first housing and comprising connector pins to terminate said multiple leads external to said second housing, one or more of said connector pins arranged to connect to said external system,
said multiple leads including at least one lead comprising multiple predefined bases and multiple other leads, said multiple predefined bases to connect to said multiple components external to said integrated circuit and formed on a linear portion of said at least one lead between said electrical contacts and said connector pins, said multiple components placed as crossovers between said multiple other leads and said at least one lead along said multiple paths to said integrated circuit from said external system.

2. The apparatus of claim 1, wherein said integrated circuit comprises a sensing element.

3. The apparatus of claim 1, wherein said components comprise at least one resistor.

4. An apparatus, comprising:
a leadframe supporting an integrated circuit, said leadframe comprising multiple leads extending linearly from said integrated circuit, said multiple leads comprising electrical contacts to form interfaces to said integrated circuit, wherein multiple electrical contacts are connected to said integrated circuit for establishing multiple paths to said integrated circuit from an external system, said multiple leads including a first lead and a second lead comprising parallel paths to said integrated circuit;
a first housing and a second housing encapsulating separate portions of said leadframe and comprising separate plastic overmoldings to form sealed enclosures for protecting said separate portions, said first housing enclosing said integrated circuit, said first lead extending from said first housing and comprising a connector pin to terminate said first lead external to said second housing and to connect to said external system;
a first component external to said integrated circuit and enclosed by said second housing, said first component attached to predefined bases of said first and second leads and operating in serial to said parallel paths; and
a second component external to said integrated circuit and enclosed by said second housing, said second component attached to a predefined base of a third lead and a predefined base of one of said first and second leads, said predefined bases formed on linear portions of said first, second, and third leads along said parallel paths between said electrical contacts and said connector pins.

5. The apparatus of claim 4, wherein said first component comprises a resistor.

6. The apparatus of claim 4, said second component operating in parallel to at least one of said parallel paths.

7. The apparatus of claim 6, wherein said second component comprises a capacitor.

8. An apparatus, comprising:
a leadframe supporting an integrated circuit, said leadframe comprising multiple leads extending linearly from said integrated circuit, said multiple leads comprising electrical contacts to form interfaces to said integrated circuit, wherein multiple electrical contacts are connected to said integrated circuit for establishing multiple paths to said integrated circuit from an external system, said multiple leads including a first lead and a second lead comprising a serial path to said integrated circuit;
a first housing and a second housing encapsulating separate portions of said leadframe and comprising separate plastic overmoldings to form sealed enclosures for protecting said separate portions, said first housing enclosing said integrated circuit, said first lead extending from said first housing and comprising a connector pin to terminate said first lead external to said second housing and to connect to said external system;
a first component external to said integrated circuit and enclosed by said second housing, said first component attached to a predefined base of a third lead and a predefined base of at least one of said first lead and said second lead and operating in parallel to said serial path; and a second component external to said integrated circuit and enclosed by said second housing, said second component attached to a predefined base of said first lead and a predefined base of said second lead, said predefined bases formed on linear portions of said first, second, and third leads along said serial path between said electrical contacts and said connector pins.

9. The apparatus of claim 8, wherein said first component comprises a capacitor.

10. The apparatus of claim 8, wherein said serial path comprises said second component.

11. The apparatus of claim 10, wherein said second component comprises a resistor.

12. An apparatus, comprising:

a leadframe supporting an integrated circuit, said leadframe comprising multiple leads extending linearly from said integrated circuit, said multiple leads comprising electrical contacts to form interfaces to said integrated circuit, wherein multiple electrical contacts are connected to said integrated circuit for establishing multiple paths to said integrated circuit from an external system, said multiple leads including a first lead and a second lead comprising parallel paths to said integrated circuit;

a first housing and a second housing encapsulating separate portions of said leadframe and comprising separate plastic overmoldings to form sealed enclosures for protecting said separate portions, said first housing enclosing said integrated circuit, said first lead extending from said first housing and comprising a connector pin to terminate said first lead external to said second housing and to connect to said external system;

a first component external to said integrated circuit and enclosed by said second housing, said first component attached to a predefined base of a third lead and a predefined base of one of said first lead and said second lead and operating in parallel to at least one of said parallel paths; and a second component external to said integrated circuit and enclosed by said second housing, said second component attached to a predefined base of said first lead and a predefined base of said second lead, said predefined bases formed on linear portions of said first, second, and third leads along said parallel paths between said electrical contacts and said connector pins.

13. The apparatus of claim 12, wherein said first component comprises a capacitor.

14. An apparatus comprising:

a leadframe comprising multiple leads extending linearly from an integrated circuit, said multiple leads comprising electrical contacts to form interfaces to said integrated circuit, wherein multiple electrical contacts are connected to said integrated circuit for establishing multiple paths to said integrated circuit from an external system;

a first housing and a second housing encapsulating separate portions of said leadframe and comprising separate plastic overmoldings to form sealed enclosures for protecting said separate portions, said first housing enclosing said integrated circuit, said multiple leads extending from said first housing and comprising connector pins to terminate said multiple leads external to said second housing, one or more of said connector pins arranged to connect to said external system, said multiple leads including a first lead comprising an upper portion disjointed from a lower portion;

a first component external to said integrated circuit and enclosed by said second housing, said first component attached to predefined bases of said upper portion and said lower portion and forming a serial connection to said integrated circuit; and a second component external to said integrated circuit and enclosed by said second housing, said second component attached to a predefined base of a second lead and a predefined base of said lower portion of said first lead, said predefined bases of said second lead and said lower portion of said first lead formed on linear portions of said first and second leads along said multiple paths between said electrical contacts and said connector pins.

15. The apparatus of claim 14, wherein said first component comprises a resistor.

16. The apparatus of claim 14, said second component operating in parallel to said serial connection.

17. The apparatus of claim 16, wherein said second component comprises a capacitor.

18. A leadframe, comprising:

support means for supporting an integrated circuit;

connecting means for establishing multiple paths to said integrated circuit from an external system, said connecting means extending linearly from said integrated circuit and comprising contact means for forming interfaces to said integrated circuit, wherein said contact means are connected to said integrated circuit for establishing a first path and multiple other paths to said integrated circuit;

housing means comprising a first housing and a second housing for encapsulating separate portions of said leadframe and comprising separate plastic overmoldings to form sealed enclosures for protecting said separate portions, said first housing enclosing said integrated circuit, said second housing enclosing multiple components placed on said connecting means external to said integrated circuit, said connecting means extending from said first housing and comprising terminating means for terminating said connecting means external to said second housing, one or more of said terminating means arranged to connect to said external system; and attaching means for attaching said multiple components to said first path, said attaching means formed on linear portions of said connecting means between said contacting means and said terminating means, said multiple components placed as crossovers between said multiple other paths and said first path along said connecting means.

19. A method, comprising:

fabricating a leadframe comprising multiple leads extending linearly from an integrated circuit, said multiple leads terminating at connector pins and comprising electrical contacts to form interfaces to said integrated circuit;

fabricating multiple predefined bases on a linear portion of at least one lead between said electrical contacts and said connector pins, said multiple predefined bases arranged to connect to components external to said integrated circuit;

placing said components as crossovers between multiple other leads and said at least one lead along multiple paths to said integrated circuit from an external system;

connecting multiple electrical contacts to said integrated circuit for establishing said multiple paths to said integrated circuit from said external system; and encapsulating separate portions of said leadframe in a first housing and a second housing comprising separate plastic overmoldings to form sealed enclosures for protecting said separate portions, said first housing enclosing said integrated circuit, said second housing enclosing said components placed on said multiple leads external to said integrated circuit, said multiple leads extending from said first housing, said connector pins to terminate said multiple leads external to said second housing, one or more of said connector pins arranged to connect to said external system.

20. The method of claim 19, wherein said components comprise a resistor and a capacitor.

21. The method of claim 19, further comprising packaging said leadframe.

22. A method comprising:

supporting an integrated circuit with a leadframe, said leadframe including multiple leads extending linearly from said integrated circuit, said multiple leads terminating at connector pins and comprising electrical contacts to form interfaces to said integrated circuit, said multiple leads including a first lead comprising a first predefined base and a second predefined base;

connecting multiple electrical contacts to said integrated circuit for establishing multiple paths to said integrated circuit from an external system;

attaching a first component to said first predefined base and a predefined base of a second lead to form a serial connection to said integrated circuit;

attaching a second component to said second predefined base and a predefined base of a third lead, said predefined bases formed on linear portions of said first, second, and third leads along said serial connection between said electrical contacts and said connector pins; and encapsulating separate portions of said leadframe in a first housing and a second housing comprising separate plastic overmoldings to form sealed enclosures for protecting said separate portions, said first housing enclosing said integrated circuit, said second housing enclosing said first component and said second component external to said integrated circuit, said connector pins to terminate said multiple leads external to said second housing, one or more of said connector pins arranged to connect to said external system.

23. The method of claim 22, wherein said first component comprises a resistor.

24. The method of claim 22, further comprising operating said second component in parallel to said serial connection.

25. The method of claim 22, wherein said second component comprises a capacitor.

* * * * *